United States Patent [19]

Koopman et al.

[11] Patent Number: 5,447,264
[45] Date of Patent: Sep. 5, 1995

[54] RECESSED VIA APPARATUS FOR TESTING, BURN-IN, AND/OR PROGRAMMING OF INTEGRATED CIRCUIT CHIPS, AND FOR PLACING SOLDER BUMPS THEREON

[75] Inventors: Nicholas G. Koopman, Raleigh; Glenn A. Rinne, Cary; Iwona Turlik, Raleigh, all of N.C.

[73] Assignee: MCNC, Research Triangle Park, N.C.

[21] Appl. No.: 270,166

[22] Filed: Jul. 1, 1994

[51] Int. Cl.[6] .................. H05K 3/34; B23K 37/04; B23K 3/06
[52] U.S. Cl. ..................... 28/563; 228/56.5; 228/6.2
[58] Field of Search .......... 228/6.2, 56.3, 56.5, 228/246, 254; 118/712, 255; 257/668

[56] References Cited

U.S. PATENT DOCUMENTS

| | | | |
|---|---|---|---|
| 1,128,515 | 2/1915 | Rietzel | 228/56.3 |
| 4,209,893 | 7/1980 | Dyce et al. | 228/56.3 |
| 4,774,760 | 10/1988 | Seaman et al. | 228/246 |
| 4,950,623 | 8/1990 | Dishon | 437/183 |
| 4,975,079 | 12/1990 | Beaman et al. | 439/482 |
| 5,006,792 | 4/1991 | Malhi et al. | 324/158 |
| 5,007,163 | 4/1991 | Pope et al. | 29/840 |
| 5,065,227 | 11/1991 | Frankeny et al. | 357/74 |
| 5,071,359 | 12/1991 | Arnio et al. | 439/91 |
| 5,073,117 | 12/1991 | Malhi et al. | 439/71 |
| 5,118,386 | 6/1992 | Kataoka et al. | 156/656 |
| 5,161,729 | 11/1992 | Dunaway et al. | 228/179 |
| 5,213,676 | 5/1993 | Reele et al. | 205/118 |
| 5,234,149 | 8/1993 | Katz et al. | 228/123.1 |
| 5,237,269 | 8/1993 | Aimi et al. | 324/158 |
| 5,245,751 | 9/1993 | Locke et al. | 29/852 |
| 5,289,631 | 3/1994 | Koopman et al. | 29/840 |
| 5,323,947 | 6/1994 | Juskey et al. | 228/56.3 |

FOREIGN PATENT DOCUMENTS 55-111127 8/1980 Japan.
2247565 3/1992 United Kingdom.

OTHER PUBLICATIONS

*Solder Rework Technique*, R. J. Herdzik and P. A. Totta, IBM Technical Bulletin, vol. 21, No. 12, May 1979.
*Solder Volume Optimization*, R. J. Herdzik and P. A. Totta, IBM Technical Bulletin, vol. 21, No. 12, May 1979.
*Decal Solder Transfer*, R. J. Herdzik and P. A. Totta, IBM Technical Bulletin, vol. 22, No. 12, Aug. 1979.
*Method to Change Solder Composition of Chip*, R. J. Herdzik and P. A. Totta, IBM Technical Bulletin, vol. 22, No. 3, Aug. 1979.

*Primary Examiner*—Samuel M. Heinrich
*Attorney, Agent, or Firm*—Bell, Seltzer, Park & Gibson

[57] ABSTRACT

A temporary substrate for solder bumps may be used to transfer solder bumps to a microelectronic device. The temporary substrate includes a solder nonwettable surface and a plurality of conductive vias therein. A solder bump is formed on each of the conductive vias and is electrically and mechanically connected thereto. The solder bump extends over the solder nonwettable surface to produce a solder bump cross-sectional area which is greater than the cross-sectional area of the conductive via. A microelectronic device is placed adjacent the temporary substrate with each input/output pad adjacent a respective solder bump. An electrical and mechanical connection is formed between the solder bump and the input/output pad, and the microelectronic device is separated from the temporary substrate with the solder bump remaining connected to the input/output pad. The temporary substrate can also be used for burn-in and testing of microelectronic devices and rework on multichip modules.

26 Claims, 5 Drawing Sheets

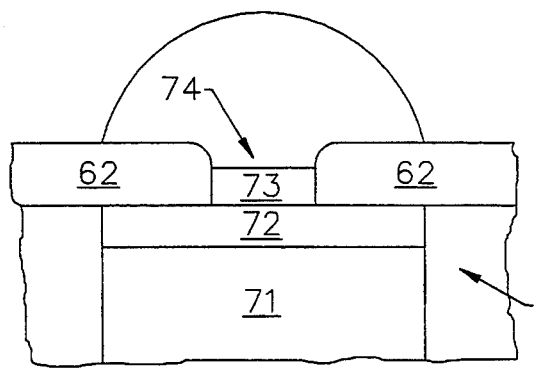 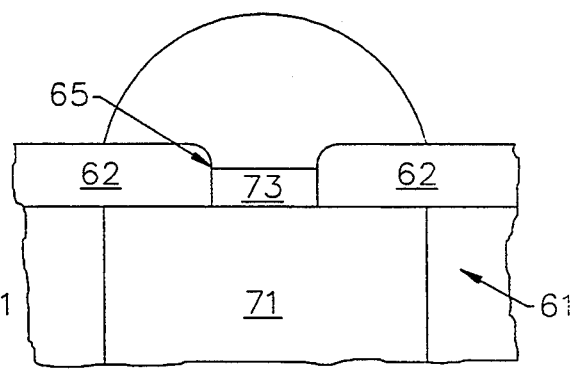
FIG. 7A.  FIG. 7B.
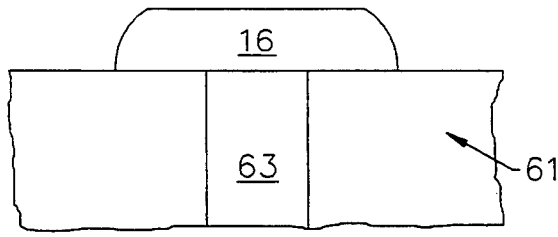
FIG. 7C.
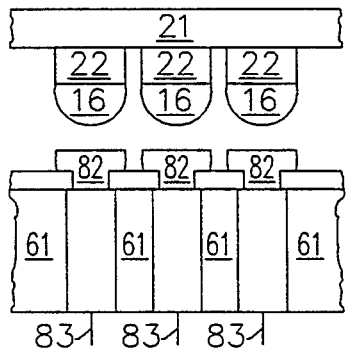 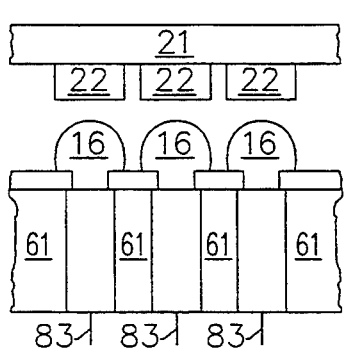 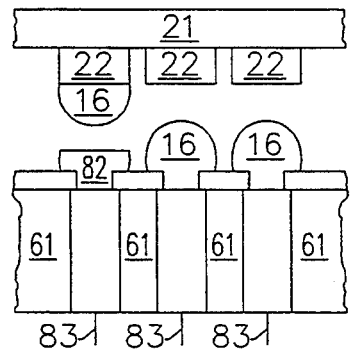
FIG. 8A.  FIG. 8B.  FIG. 8C.
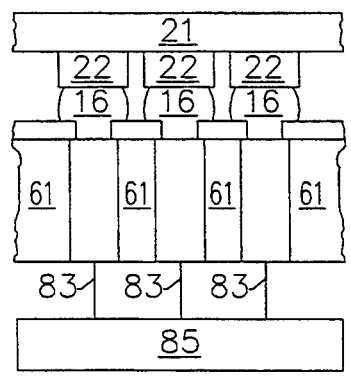
FIG. 8D.

RECESSED VIA APPARATUS FOR TESTING, BURN-IN, AND/OR PROGRAMMING OF INTEGRATED CIRCUIT CHIPS, AND FOR PLACING SOLDER BUMPS THEREON

FIELD OF THE INVENTION

This invention relates to processing of integrated circuit chips after fabrication to incorporate the integrated circuit chips into a next level of packaging such as a circuit board or substrate, and more particularly to a method and apparatus for processing solder bump or "C4" ("controlled collapse circuit connection") chips after their fabrication.

BACKGROUND OF THE INVENTION

Integrated circuit chips are typically manufactured by forming the active devices for many chips on a single wafer of semiconductor material. The wafer is metallized to form the required interconnections among the active devices. The wafer is then diced into individual chips. The chips are mounted on a next level of packaging such as a printed circuit board, a multilayer ceramic (MLC) substrate, or other substrate, to form a single chip or multi-chip module.

Microelectronic systems have required ever increasing density of input/output (I/O) connections between an integrated circuit chip and its next level packaging. Accordingly, the art has increasingly turned to an interconnection technology which uses solder bumps or solder balls to electrically and mechanically connect the chip I/O pads to pads on a next level of packaging. This interconnection technology is also known as "controlled collapse chip connections" ("C-4") or "flip chip" technology. This technology has also been used in environments which do not require high I/O densities.

Many techniques have been heretofore described for forming solder bumps on an integrated circuit chip. For example, U.S. Pat. No. 4,950,623 to Dishon entitled Method of Building Solder Bumps, assigned to the assignee of the present invention, the disclosure of which is hereby incorporated herein by reference, describes a method of forming a solder bump on an underbump metallurgy by depositing a layer of solder-soluble metal on the underbump metallurgy so as to cover the underbump metallurgy. A layer of solidified solder is then coated on the solder soluble metal. The solder is then heated until the layer of solder melts and the solder-soluble metal dissolves in the melted solder. The surface tension of the melted solder draws the solder and dissolves soluble metal away from the nonwettable passivation layer which surrounds the underbump metallurgy, to form a spheroidal solder bump.

Another solder bump fabrication technique is described in Japanese Patent No. 55-111127 by Saga et al., published on Aug. 27, 1980 and entitled Method of Building Solder Bumps. This patent describes a two-step melting process for forming solder bumps. In a first low temperature heating step, an under-bump metallurgy layer is dissolved. Then, the photoresist which was used to define the underbump metallurgy is removed and the chip is tested in an unspecified manner. Then, a high temperature heating step is performed to form a hemispherical solder bump.

Other techniques for forming solder bumps involve transfer from a decal chip onto a device chip or a multilayer ceramic structure. See, for example, IBM Technical Disclosure Bulletins Vol. 22, No. 3, page 996, August 1979 entitled Decaled Solder Transfer; Vol. 21, No. 12, May 1979 page 4835 entitled Solder Rework Technique; Vol. 21, No. 12, May 1979 page 4834 entitled Solder Volume Optimization; and Vol. 22, No. 3, August 1979, page 995 entitled Method to Change Solder Composition of Chip.

In the manufacture of chips, some testing is typically performed at the wafer level. However, it is difficult to perform exhaustive tests of the chips at the wafer level. Similarly, some tests are performed at the module level after the chip is incorporated into the next level package. However, detection of failure at this level often requires scrapping the entire package or may require expensive rework of the package. Accordingly, it is highly desirable to perform testing of the chip after it has been diced from the wafer but before it is mounted on a next level package. Testing, as used herein, includes any and all operations, electrical or otherwise, which are typically performed on integrated circuits. Examples of such operations include parametric measurements, verification of functionality, erasure of Erasable Programmable Read-Only Memories (EPROM), programming of Programmable Logic Devices (PLDS) and power-on burn-in. Similarly, it is highly desirable to perform a "burn-in" at elevated temperatures (e.g. 160° C.) and for long times (e.g. hundreds of hours) to identify early failures.

Unfortunately, it is difficult to perform "burn-in and test" on chips having solder bumps thereon. These chips are difficult to probe due to the very high density and close spacing of the solder bumps. Moreover, if the solder bumps are probed and simultaneously burned-in, distortion and squashing of the solder bumps typically occurs, which renders the chips unusable or requires expensive rework. Chip burn-in may also damage the next level package.

Techniques have recently been developed to allow test and burn-in of C-4 chips. For example, U.S. Pat. Nos. 5,006,792 and 5,073,117 both to Malhi et al. and both entitled Flip-Chip Test Socket Adaptor and Method, describe a test socket which includes a plurality of cantilever beams for making electrical contact to a bare chip. The cantilevers are designed to deflect and compensate for variations in solder bumps on the bare chips. Unfortunately, since solder bump connections typically are formed in an array over the entire face of an integrated circuit chip, it is difficult to form cantilever beam connections to all of the solder bumps. Moreover, these beams may squash the solder bumps during burn-in and test.

Another electrical connector for contacting C-4 chips during burn-in and test is described in U.S. Pat. No. 4,975,079 to Beaman et al. entitled Connector Assembly for Chip Testing. The connector includes a plurality of rigid conductors embedded therein, and a concave opening aligned with an end of each conductor so that each concave opening exposes the conductor and mates with the contact areas on the chip. Unfortunately, such a connector may also unduly stress the solder balls during burn-in and test.

Another technique for burn-in and test of C-4 chips is described in U.S. Pat. No. 5,065,227 to Frankeny et al. entitled Integrated Circuit Packaging Using Flexible Substrate. An integrated circuit chip having solder balls thereon is mounted on a substrate having input/output lines which extend outward from the integrated circuit footprint to an area on the substrate which is accessible. The integrated circuit chip can thereby be tested prior to mounting on its ultimate carrier. Once tested, the chip and the substrate are excised from the roll of substrate material. This excised, pretested package, which includes both the chip and the flexible substrate, can be mounted directly onto the ultimate carrier. Unfortunately, the flexible substrate is an additional package level which may impact the reliability of the overall package, and limits the density and performance attainable.

Another technique for testing C-4 chips is described in U.S. Pat. No. 5,007,163 to Pope et al. entitled Non-Destructure (sic) Method of Performing Electrical Burn-In Testing of Semiconductor Chips. An electrically conductive, liquid eutectic joint is formed at room temperature with low pressure between electrical terminals on a chip and a circuitized substrate. The eutectic joint remains liquid at test temperatures, while enabling test completion. At the end thereof, chips and pads are separated and any eutectic material residue thereon is removed. Unfortunately, the liquid burn-in/test interconnections may be unreliable and the liquid eutectic joint may be unstable. Moreover, the liquid eutectic may alloy with the solder bumps and thus may be difficult to remove.

Yet another technique for testing C-4 chips is described in U.K. Patent 2,247,565A entitled A Method of Testing a Semiconductor Device. An integrated circuit chip having solder bumps thereon is flip chip bonded to a compact test and burn-in silicon substrate which is larger than the integrated circuit chip device. The silicon substrate is provided with solderable metallization pads and solder bumps if required, and the pads are significantly smaller in dimension than those on the IC devices. See U.K. Patent 2,247,565,A, page 4, lines 7–10. The substrate may then be accessed by means of a standard probe card, allowing the integrated circuit chip to be tested and subjected to burn-in procedures. After test and burn-in, the device is separated from the substrate. The use of smaller pads on the substrate insures that the bonds will separate with the majority of the solder volume retained on the integrated circuit device. Due to the small size of the metallization pads, however, this method may require difficult alignment procedures when mating the solder bumps on the integrated circuit device to the small metallization pads of the substrate.

Another technique for testing integrated circuit chips is disclosed in U.S. Pat. No. 5,237,269 to Aimi et al. entitled Connections Between Circuit Chips and a Temporary Carrier for Use in Burn-in Tests. A circuit chip to be tested is attached to a temporary, sacrificial carrier to perform burn-in and test steps of a chip fabrication process. The connection between the solder balls of the chip and lead lines or paths of solder wettable material is made by placing the chips on the carrier and heating to reflow the solder. The lead line is covered by an overlay of nonwettable material to which solder will not adhere. The overlay has an opening through which solder flows to make a restricted joint between the solder ball and the lead line. After burn-in, these restricted joints are sheared off without causing damage to the chips or carrier. Again, this technique may require precise alignment when placing the solder balls of the chip in contact with the exposed lead line.

A major advance in the testing of C-4 chips is described in U.S. Pat. No. 5,289,631 to the inventors of the present invention, entitled Method and Apparatus for Testing, Burn-in, and/or Programming of Integrated Circuit Chips, and for Placing Solder Bumps Thereon, the disclosure of which is hereby incorporated herein by reference. A temporary substrate includes a solid phase sacrificial conductor layer on temporary substrate pads. The sacrificial conductor is electrically connected to the input/output pads of an integrated circuit chip through a solder bump. A solid phase mechanical connection between the input/output pad of the chip and the corresponding temporary substrate pad is formed by heating the solder bumps. After testing, the sacrificial conductor layer is dissolved into the solder bumps by heating at an elevated temperature. Having dissolved the sacrificial layer therein, the integrated circuit chip, including the solder bump, may be easily removed from the temporary substrate. This technique, including a sacrificial conductor layer, does not require precise alignment because the temporary substrate pads are not restricted in size.

SUMMARY OF THE INVENTION

It is therefore an object of the present invention to provide an improved method and apparatus for burn-in and test of solder bump or C-4 chips.

It is another object of the present invention to provide an improved method and apparatus for the transfer of solder bumps to a pad.

It is yet another object of the present invention to provide an improved method and apparatus for burn-in and test of solder bump chips which do not require precise alignment of the chip to a temporary substrate.

It is still another object of the present invention to provide an improved method and apparatus for burn-in and test of solder bump chips which do not require a sacrificial conductor layer on the temporary substrate pads.

These and other objects are provided by forming solder bumps on a temporary substrate over a recessed via on the substrate and extending onto a nonwettable material adjacent the via. Thus, the solder bump has a larger cross-sectional area on the temporary substrate than the recessed via. The solder bump can then be attached to a solder wettable input/output pad on a microelectronic device which can then be tested. When testing is complete, the microelectronic device may be removed by pulling the device apart from the temporary substrate. The microelectronic device may be pulled from the substrate in either a hot or cold pull. Since the connection of the solder bump through the recessed via is small relative to the connection of the solder bump to the input/output pad of the microelectronic device, the solder bump separates cleanly from the recessed via.

The invention allows solder bumps to be formed over small vias, for example by plating. Large solder bumps can be easily aligned to the large input/output pads on the microelectronic substrate. Yet once attached, the solder bumps can be easily detached from the smaller recessed vias. A sacrificial conductor layer is not required.

In particular, a method according to the invention provides a temporary substrate, having a plurality of conductive vias therein, at locations corresponding to the plurality of input/output pads on a microelectronic device. These conductive vias extend to a face of the temporary substrate, and the temporary substrate includes a solder nonwettable material at the substrate face, adjacent to the conductive vias. A solder bump is formed on a respective one of the conductive vias, mechanically connected thereto and extending onto the solder nonwettable material such that the solder bump has a cross-sectional area which is greater than the cross-sectional area of the conductive via at the substrate face. The solder bumps may be formed by plating on the conductive vias. A microelectronic device is placed adjacent the temporary substrate, with the input/output pads thereof adjacent a respective solder bump. The solder bump is heated to form a solid phase mechanical and electrical connection between corresponding input/output pads and solder bumps.

Later, the microelectronic device is separated from the temporary substrate, such that the solder bumps detach from the conductive vias and remain attached to the input/output pads. The step of separating the microelectronic substrate from the temporary substrate may comprise a step of applying either a shearing or a pulling force between the microelectronic device and the temporary substrate. The step of separating the microelectronic device from the temporary substrate may be performed either hot or cold. The method as described above can be applied to either flexible substrate structures or ceramic substrate structures.

For flexible substrate applications, a temporary substrate is provided having a plurality of apertures therein, at locations corresponding to the plurality of input/output pads on a microelectronic device, and extending through the substrate, from a first face thereof to a second face thereof opposite the first face, the first face and second face being nonwettable to solder adjacent the apertures. Solder stems are formed in the apertures, extending from the first face to the second face, and solder bumps are formed on the first face over the solder stem, and electrically and mechanically connected thereto and extending onto the solder nonwettable material such that the solder bump has a cross-sectional area which is greater than the cross-sectional area of the solder stem at the substrate face. A microelectronic device is placed adjacent the temporary substrate with the input/output pads thereof adjacent a respective solder bump. The solder bumps are heated to form a solid phase mechanical and electrical connection between corresponding input/output pads and solder bumps. The microelectronic device is later separated from the temporary substrate such that the solder bumps detach from the temporary substrate and remain attached to the input/output pads.

For flexible substrate applications, the step of providing a temporary substrate may comprise the step of providing a temporary substrate having a plurality of apertures therein, at locations corresponding to the plurality of input/output pads on a microelectronic device, and extending through the substrate, from a first face thereof, to a second face thereof, opposite the first face, the first and second faces being nonwettable to solder adjacent the apertures. The temporary substrate may further include a conductive layer on the second face having a plurality of reservoirs therein adjacent a respective aperture and covering the aperture. The forming step may comprise the steps of forming solder plugs in the reservoirs; forming solder stems in the apertures, extending from the first face to the second face; and forming solder bumps on the first face over the solder stem, and electrically and mechanically connected thereto and extending onto the solder nonwettable material such that the solder bump has a cross-sectional area which is greater than the cross-sectional area of the solder stem at the substrate face. In addition, the placing step may be preceded by the step of removing the conductive layer from the temporary substrate.

Alternatively, a substrate is provided having a plurality of conductive vias therein, at locations corresponding to the plurality of input/output pads, the conductive vias extending to a face of the substrate. In this context, the substrate may comprise a monolayer ceramic substrate, a multilayer ceramic substrate, a printed circuit board, or any other substrate to which a microelectronic device may be soldered. A solder nonwettable layer is provided on the substrate face and extends over the conductive vias. The solder nonwettable layer includes an aperture therein, over each of the vias, the aperture having a cross-sectional area which is less than the cross-sectional area of the vias. A conductive stem is formed in the apertures, electrically and mechanically connected to the associated vias. A plurality of solder bumps are formed, a respective one of which is mechanically and electrically connected to a respective one of the conductive stems at the substrate face, and extends onto the solder nonwettable layer on the substrate face. The solder bumps have cross-sectional areas on the substrate face which are sufficiently greater than the cross-sectional areas of the stems at the substrate face, so as to prevent separation of the solder bump from the associated stem, upon application of a mechanical force thereto.

A microelectronic device is placed adjacent the temporary substrate, with the input/output pads thereof adjacent a respective solder bump. The solder bumps are heated to form a solid phase mechanical and electrical connection between corresponding input/output pads and solder bumps. The microelectronic substrate is later separated from the temporary substrate such that the solder bumps detach from the temporary substrate and remain attached to the input/output pads. The separating step may be proceeded by the step of testing the microelectronic substrate.

Accordingly, a temporary substrate according to the invention has a plurality of conductive vias therein, the conductive vias extending to a face of the substrate, the substrate further including solder nonwettable material at the substrate face adjacent the conductive vias. The temporary substrate also includes a plurality of solder bumps, a respective one of which is mechanically and electrically connected to a respective one of the conductive vias at the substrate face, and extends onto the solder nonwettable material adjacent the conductive via at the substrate face. The solder bumps have cross-sectional areas on the substrate face which are sufficiently greater than the cross-sectional area of the conductive vias at the substrate face, so as to permit separation of the solder bump from the associated conductive via, upon application of a mechanical force thereto. The solder bumps are preferably free of mechanical and electrical connection other than mechanical and electrical connection to the conductive vias.

The temporary substrate may be a flexible substrate. In addition, the temporary substrate may comprise a conductive layer on the second face, extending over the solder filled vias. The conductive via may also include a first portion adjacent the substrate face and a second portion opposite the substrate face, the first portion having cross-sectional area which is smaller than the cross-sectional area of the second portion, the solder bump being electrically and mechanically connected to the first portion.

For flexible substrate applications, the temporary substrate preferably has a plurality of apertures therein extending through the substrate, from a first face thereof to a second face thereof opposite the first face, the first and second faces being nonwettable to solder adjacent the apertures. A plurality of solder structures are included. A respective solder structure comprises a solder stem in one of the apertures, extending from the first face to the second face; and a solder bump on the first face over the solder stem, and electrically and mechanically connected thereto. A solder structure may also include a solder plug on the second face over the solder stem, and electrically and mechanically connected thereto. The solder bumps of this structure may have cross-sectional areas on the substrate face which are sufficiently greater than the cross-sectional area of the solder stem at the first face, so as to permit separation of the solder bump from the solder stem, upon application of a mechanical force thereto.

Alternatively, the temporary substrate has a plurality of conductive vias therein, and the conductive vias extend to a face of the substrate. A solder nonwettable layer is on the substrate face and extends over the conductive vias. The solder nonwettable layer includes an aperture therein over each of the vias, the aperture having a cross-sectional area that is less than the cross-sectional area of the vias. A conductive stem is in each of the apertures, electrically and mechanically connected to the associated via. A plurality of solder bumps are included, a respective one of which is mechanically and electrically connected to a respective one of the conductive stems at the substrate face. Each solder bump extends onto the solder nonwettable layer on the substrate face. The solder bumps have cross-sectional areas on the substrate face which are sufficiently greater than the cross-sectional area of the stems at the substrate face, so as to permit separation of the solder bump from the associated stem upon application of a mechanical force thereto.

The temporary substrate of the present invention can be used in rigid or flexible substrate applications. In all embodiments, a solder bump is connected to the temporary substrate by a via or a stem having a cross-sectional area which is small relative to the cross-sectional area of the pad to which the solder bump will be transferred. The pad may be an input/output pad on either a microelectronic device or a multichip module. Because the solder bump on the temporary substrate and the input/output pad are both relatively large, alignment of the bump to the pad can be performed with existing high capacity production equipment. Because the cross-sectional area of the subsequent connection of the pad to the solder bump is large relative to the cross-sectional area of the connection of the temporary substrate via or stem to the solder bump, a pulling or shearing force may be used to separate the pad from the temporary substrate with the solder bump remaining connected to the pad. Accordingly, a microelectronic device or multichip module can be easily aligned with the temporary substrate having solder bumps, yet the temporary substrate can be easily detached from the microelectronic device or multichip module thereby transferring the solder bumps without requiring a sacrificial conductor layer.

BRIEF DESCRIPTION OF THE DRAWINGS

FIGS. 7A–7C illustrate alternate via and solder structures on ceramic substrates.

FIGS. 8A–8D illustrate the joining of a microelectronic device to a ceramic substrate having solder bumps for burn-in and test.

DETAILED DESCRIPTION OF PREFERRED EMBODIMENTS

Figure 1A:
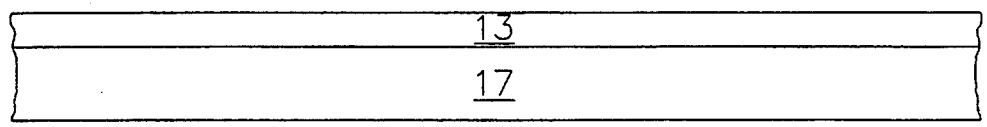
FIGS. 1A–1E illustrate a method of fabricating a temporary substrate for solder bumps adapted for flexible substrate applications.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

In FIGS. 1A–1E there is shown a method for fabricating a temporary substrate 11 for solder bumps adapted for flexible substrate applications. In FIG. 1A, a solder nonwettable layer 13 is formed on a conductive layer 17. The solder nonwettable layer may comprise a layer of polyimide, silicon dioxide, silicon nitride, benzocyclobutene (BCB), chromium, or multiple layers of the above mentioned or other solder nonwettable materials. In a preferred embodiment, the solder nonwettable layer 13 comprises a layer of chromium adjacent the conductive layer 17 and a layer of polyimide, silicon dioxide, silicon nitride, or benzocyclobutene BCB, on the layer of chromium opposite the conductive layer. The chromium provides a solder dam which limits the reaction between the conductive layer and the solder. The conductive layer 17 may comprise a layer of nickel, copper, palladium, or layers of other conductive materials.

Figure 1B:
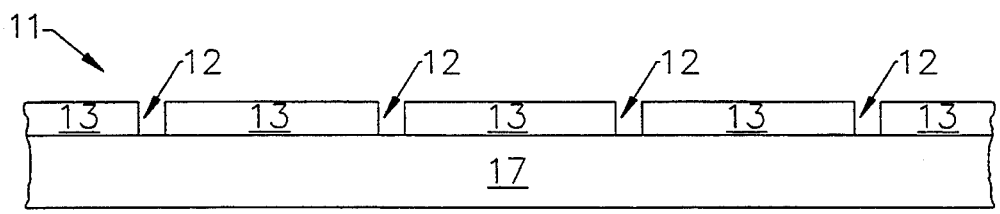
Figure 1C:
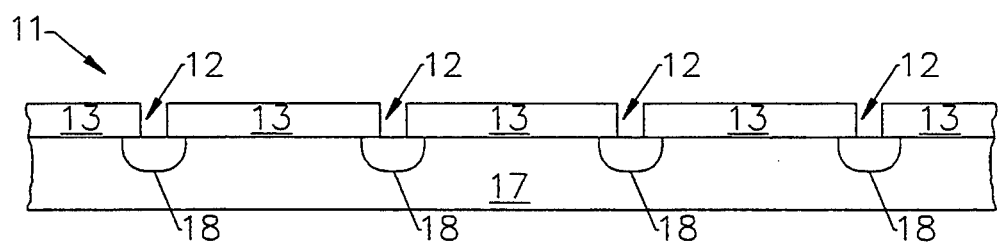

In Figure 1B, there is shown the step of forming apertures 12 in the solder nonwettable layer 13 thereby exposing the conductive layer 17. The apertures may be formed by selectively etching the solder nonwettable layer. In the alternative, the solder nonwettable layer may be selectively formed thereby defining the apertures 12. In FIG. 1C, reservoirs 18 are optionally formed. These reservoirs 18 may be formed by etching the exposed conductive layer to a predetermined depth thereby undercutting the solder nonwettable layer.

Figure 1D:
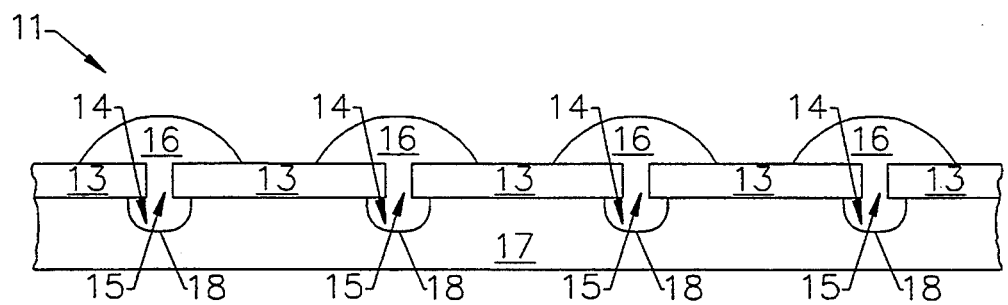

In FIG. 1D, there is shown the step of forming solder plugs 14, solder stems 15, and solder bumps 16. In one embodiment of this step, these solder structures are formed in a plating operation. In this plating operation, the solder nonwettable layer 13, the apertures 12, and the reservoirs 18 are exposed to a plating solution. An electrical bias is applied to the conductive layer 17. Accordingly, solder from the plating solution plates the exposed conductive layer 17 in the reservoirs 18. As the plating process continues, solder fills the reservoirs 18 forming solder plugs 14. The solder then fills apertures 12 forming solder stems 15. Solder bumps 16 then form extending onto the solder nonwettable layer adjacent the aperture.

As is well known to those having skill in the art, the size of the solder bump is determined by the concentration of the plating solution, the magnitude of the electrical bias, and the duration of the plating process. In this embodiment a common electrical bias is applied to all of the solder bumps. The solder bumps have cross-sectional areas on the solder nonwettable layer which are sufficiently greater than the cross-sectional area of associated solder stems, so as to permit separation of the solder bump from the solder stem, upon application of a mechanical force thereto. In addition, the conductive layer may be removed, such as by etching, as illustrated in FIG. 1E.

Figure 1E:
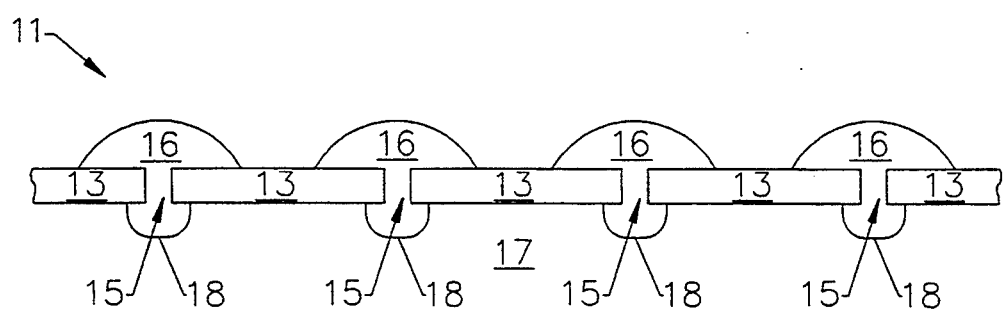

The structures illustrated in FIGS. 1D and 1E may be used in solder transfer chip applications. If the layers are thin enough so as to allow sufficient flexibility, either structure may be adapted for use in tape and reel applications. For tape and reel applications, the temporary substrate is formed as a long tape and wound on a reel for storage. The temporary substrate structure of FIG. 1D may be replated with solder after use thereby allowing reuse.

Figure 2A:
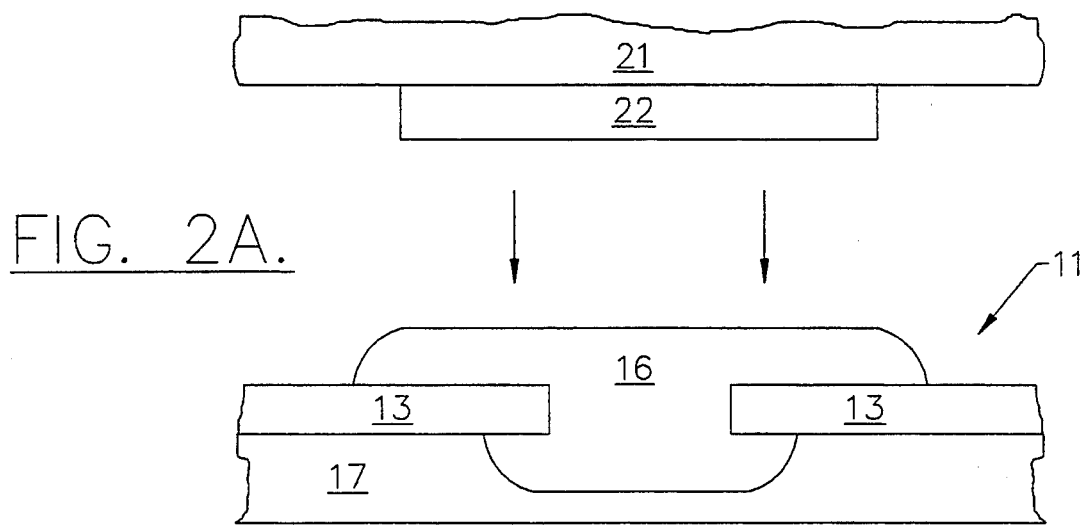
FIGS. 2A–2C illustrate a method of transferring a solder bump formed according to the method of FIGS. 1A–1E, to an input/output pad of a microelectronic device from a temporary substrate.
Figure 2B:
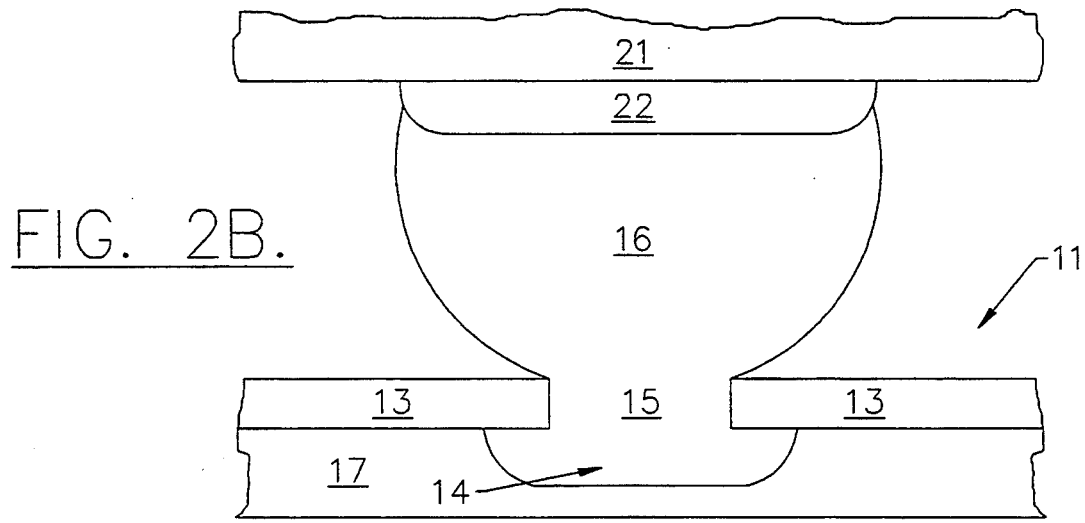
Figure 2C:
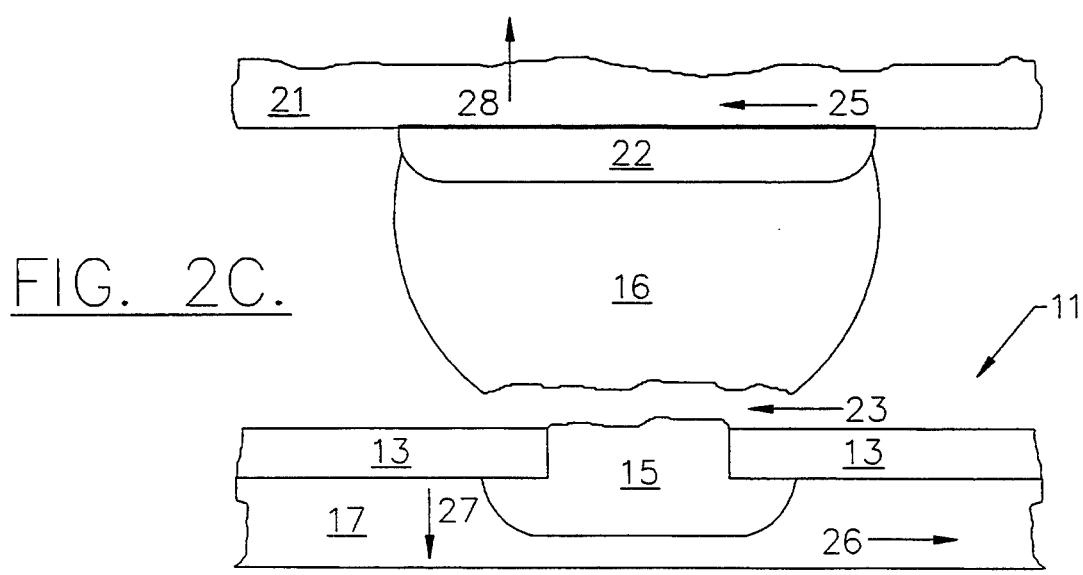

FIGS. 2A-2C illustrate the transfer of a solder bump 16 from a temporary substrate 11 as illustrated in FIG. 1D to a microelectronic device 21. The microelectronic device may comprise an integrated circuit chip, a multichip module, or any other device having pads requiring solder bumps. In FIG. 2A, there is shown the step of aligning an input/output pad 22 of a microelectronic device 21 with a solder bump 16 of a temporary substrate 11. The relatively large size of the input/output pad 22 and the solder bump 16 allows the use of existing high capacity pick and place equipment to perform this operation. The input/output pad 22 is placed in contact with the solder bump 16. The two elements need only touch and exact placement is not required. As long as the solder wettable input/output pad touches the solder bump, the surface tension of the melted solder will pull the pad into exact alignment. The solder bump 16 is heated in order to form a mechanical and electrical connection to the input/output pad 22. The heating step may occur before or after the bump and pad come into contact as long as the bump is in a liquid state at some time when the bump and pad are in contact. The solder bump 16 is then allowed to cool thereby forming a solid phase mechanical and electrical connection to the input/output pad 22.

FIG. 2B illustrates the connection between the input/output pad and the solder bump. As is shown, the cross-sectional area of the connection between the solder bump 16 and the input/output pad 22 is large relative to the cross-sectional area of the connection between the solder bump 16 and the solder stem 15. The solder bump 16 is neither electrically or mechanically connected to the solder nonwettable layer 13. In other words, the only electrical and mechanical connection between temporary substrate 11 and solder bump 16 is via the stem 15.

As shown in FIG. 2C, when a shearing or pulling force is applied between the microelectronic device 21 and the temporary substrate 11, the solder bump 16 remains attached to the input/output pad 22. A shearing force occurs when opposite forces in the directions of arrows 25 and 26 are applied to the microelectronic device 21 and the temporary substrate 11. A pulling force occurs when opposite forces are applied to the temporary substrate 11 and the microelectronic device 21 in the directions of arrows 27 and 28, respectively. The solder bump 16 detaches from the solder stem 15 at the fracture site 23. The pulling or shearing force may be applied while the solder bump 16 is either hot or cold. In either case, the majority of the solder bump 16 transfers to the input/output pad 22. For a structure having a solder stem 15 with a 1 mil diameter, the cold pull strength is about 2 grams/pad compared to a 50 gram/pad pull strength for a typical solder joint having a 5 mil diameter joint. If the conductive layer 17 has been removed as illustrated in FIG. 1E, there might be no fracture, but instead, the solder stem and the solder plug may pull through the aperture 12 in the solder nonwettable material 13.

Figure 3:
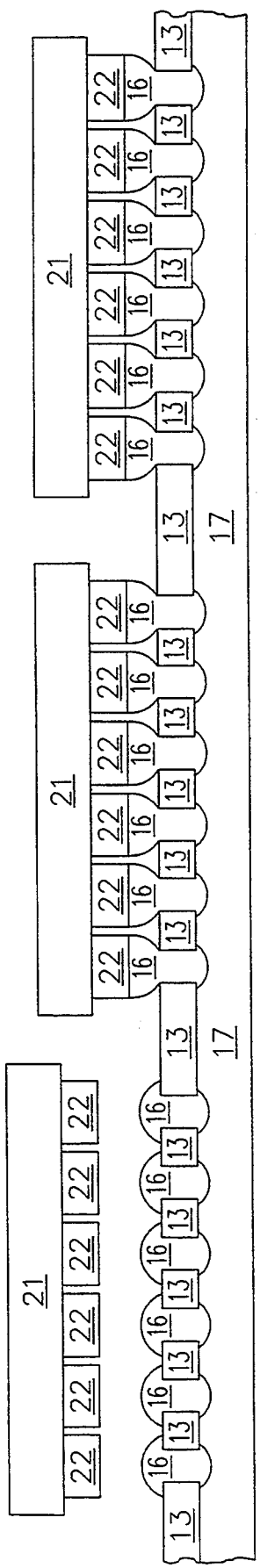
FIG. 3 illustrates a temporary substrate for solder bumps wherein microelectronic substrates may be provided with solder bumps and stored for future use.

As shown in FIG. 3, the temporary substrate of FIGS. 1D and 1E may be used to transfer solder bumps to microelectronic devices 21 as well as to provide protective storage for microelectronic devices. In the embodiment of FIG. 3, the temporary substrate 11 may include a plurality of groups of solder structures including solder bumps 16. Each solder bump 16 in a group of bumps corresponds to a respective input/output pad 22 on a microelectronic device 21. Microelectronic devices 21 are placed on the temporary substrate 11 such that respective input/output pads 22 contact associated solder bumps 16. A solid phase mechanical and electrical connection is formed between the solder bumps 16 and input/output pads 22 by heating and cooling as discussed with regard to FIGS. 2A-2C. The microelectronic devices 21 are left attached to the temporary substrate 11 until such time as needed. When needed, a microelectronic device 21 may be pulled or sheared, hot or cold, from the temporary substrate 11 As discussed with regard to FIG. 2C, the majority of each solder bump 16 remains attached to the associated input/output pad 22.

Figure 4:
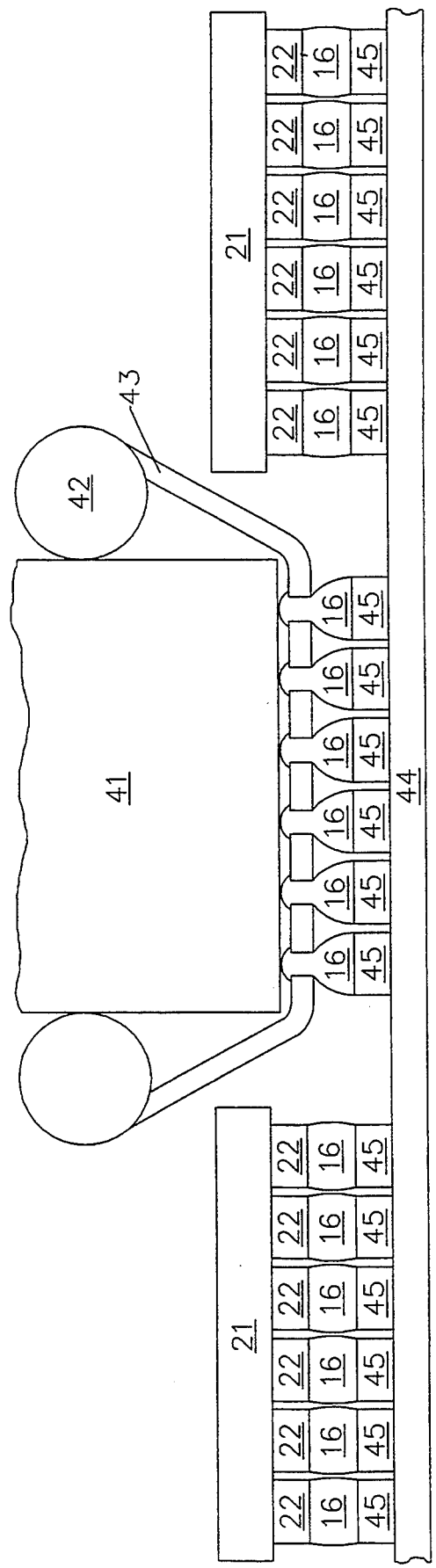
FIG. 4 illustrates a method of applying solder bumps to a permanent substrate using a tape and reel technique.

In FIG. 4, there is illustrated the application of a temporary substrate for solder bumps to a tape and reel format. In this embodiment, the temporary substrate of either FIG. 1D or 1E is flexible allowing the temporary substrate to be formed into a tape 43 which can be wound on a reel 42. The reel may be a Tape Automated Bonding (TAB) reel for use in TAB applications. As solder bumps are required, the tape 43 may be unwound and solder bumps 16 placed in contact with a surface 44 having solder pads 45 requiring solder bumps. A hot tip tool 41 is applied to the solder bump 16 thereby melting the bump. When cooled, a solid phase electrical and mechanical connection is formed between the solder bumps 16 and the solder pads 45. The surface 44 having solder pads 45 requiring solder bumps may comprise a multichip module, a microelectronic device, etc.

An advantage of the flexible tape and reel format is that the temporary substrate may be pulled from the surface 44 with attached solder bumps 16, one row of bumps at a time. The TABLE below illustrates the pull strength required to separate a temporary substrate from its solder bumps.

TABLE

| | PULL (DEJOIN) STRENGTH (LBS) | | | |
|---|---|---|---|---|
| CONDITION | 50 PADS | 500 PADS | 2,000 PADS | 5,000 PADS |
| No Stem | 5 | 50 | 200 | 500 |
| 3 MIL Stem | 1.8 | 18 | 72 | 180 |
| 2 MIL Stem | 0.8 | 8 | 32 | 80 |
| 1 MIL Stem | 0.2 | 2 | 8 | 20 |

The column headings indicate the number of pads associated with a single microelectronic device. The row headings indicate the diameter of the solder stem which is connected to the solder bump. The number associated with each combination indicates the force in pounds required to separate all the solder bumps from the temporary substrate in a single pull. Greater forces are required as the number of solder bumps is increased, and also as the cross-sectional area of the connection of each bump to a respective stem is increased. In the tape and reel format, the temporary substrate may be pulled from the microelectronic device or multichip module one row of solder bumps at a time eliminating the need for a single hard pull. For example, a microelectronic substrate with 5,000 input/output pads would require a force of 20 pounds to remove a nonflexible substrate having one mil diameter solder stems. With the flexible tape format, however, a comparable microelectronic substrate having a 70×70 (4900) array of input/output pads and 1 mil diameter solder stems requires a force of 0.3 pounds per row of solder bumps to remove the temporary substrate. This has the advantage of reducing forces exerted by the placement equipment, and also reducing the possibility of delamination of layers on the microelectronic device.

Figure 5:
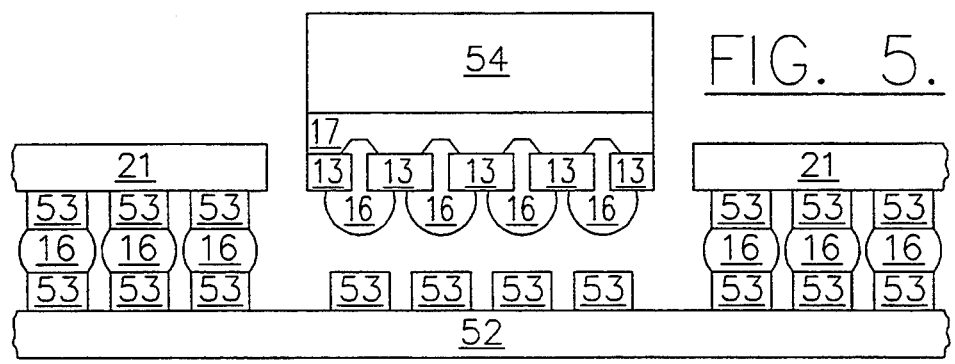
FIG. 5 illustrates a method of applying solder bumps to a rework site on a multichip module (MCM).

In FIG. 5, there is illustrated a temporary substrate for solder bumps adapted as a transfer chip 51. This embodiment is particularly adapted for providing solder bumps to rework sites on a multichip module (MCM) substrate 52. The multichip module 52 is a permanent substrate populated with a plurality of microelectronic devices 21. The multichip module includes conductive traces (not shown) which interconnect the microelectronic devices in order to perform a predetermined electronic function. Occasionally, a microelectronic device must be removed and replaced. After removal of the device, any remaining solder is removed leaving exposed MCM pads 53. A solder transfer chip 51 may then be used to apply solder to the MCM pads 53. The transfer chip has a solder nonwettable layer 13, a conductive layer and solder bumps 16 as discussed with regard to FIGS. 1A-1E. The transfer chip also includes a rigid backing 54 to facilitate handling and placement. The solder bumps 16 are arranged to correspond to MCM pads 53 and the solder transfer chip 51 is of a size to allow access to the MCM pads. Accordingly, solder bumps 16 may be transferred to MCM pads 53 from the transfer chip 51.

Figure 6A:
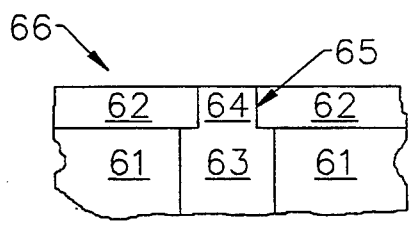
FIGS. 6A–6E illustrate a method of forming a solder bump on a ceramic substrate and the transfer of the bump to the input/output pad of a microelectronic device.

In FIGS. 6A-6E there is shown an alternate process of forming a solder bump on substrate and transferring the solder bump to a microelectronic device. In this context, the substrate may comprise a monolayer ceramic substrate, a multilayer ceramic substrate, a printed circuit board, or any other substrate to which a microelectronic device may be soldered. A ceramic substrate is illustrated in FIGS. 6A-6E. As shown in FIG. 6A, the ceramic substrate 61 includes one or more conductive vias 63. The conductive vias are exposed on a face of the substrate 61 at locations corresponding to the location of an input/output pad on a separate microelectronic device. In one embodiment, these conductive vias have separate external electrical contacts (not shown) allowing separate electrical signals to be sent to each via. The ceramic substrate also comprises a solder nonwettable layer 62 on the face of the insulating substrate and having apertures 65 over each of the conductive vias 63. These apertures have a cross-sectional area which is less than the cross-sectional area of a respective input/output pad on a corresponding microelectronic device. In addition, the cross-sectional areas of these apertures 65 is preferably less than the cross-sectional area of the vias 63. The aperture 65 is filled with a conductive stem which is mechanically and electrically connected to the conductive vias 63. The stem may comprise solder, nickel, copper, palladium, molybdenum metallurgy, or combinations of the above or other conductive materials.

Figure 6B:
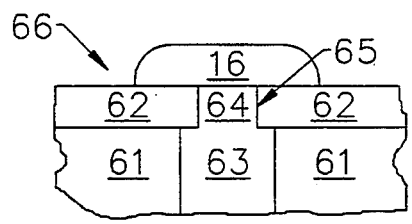

As shown in FIG. 6B, a solder bump 16 is formed on each conductive stem 64, electrically and mechanically connected thereto. The solder bump 16 extends onto the solder nonwettable layer and has a cross-sectional area which is sufficiently greater than the cross-sectional area of the stem 64 so as to permit separation of the solder bump from the associated stem upon application of a mechanical force thereto. In one embodiment, the solder bump may be formed during a plating process. In this process, the conductive stems 64 and the solder nonwettable layer 62 are exposed to a plating solution, and an electrical bias is applied to one or more of the conductive stems 64. The size of each solder bump 16 is determined by the concentration of the plating solution, the magnitude of the electrical bias applied to the associated conductive stem 64, and the duration of the process. Since different electrical biases may be applied to each conductive stem, the sizes of different solder bumps 16 on a single temporary substrate 66 may be varied. A ceramic substrate having solder bumps with different sizes is illustrated in FIG. 8C.

Figure 6C:
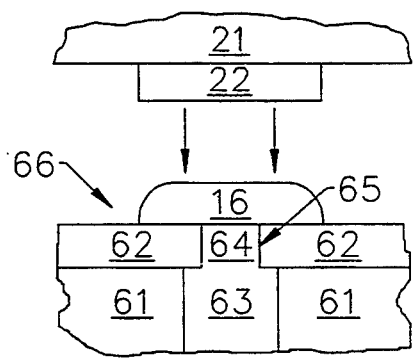

In FIG. 6C there is illustrated the step of aligning the input/output pad 22 of the microelectronic device 21 to the solder bump 16 of the temporary substrate 66. Because of the relatively large sizes of the input/output pad 22 and the solder bump 16, existing high capacity pick and place equipment may be used to perform this operation. The solder bump 16 is heated until it melts, and the input/output pad is placed in contact with the solder bump. The heating step may occur before or after the placing step. The surface tension of the liquid solder bump 16 will align the input/output pad.

Figure 6D:
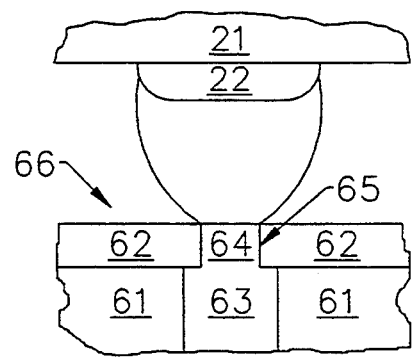

As shown in FIG. 6D, upon contact with the input/output pad 22, the heated solder bump forms an electrical and mechanical connection to the input/output pad which is large relative to the connection to the conductive stem 64. If allowed to cool, the solder bump 16 forms a solid state electrical and mechanical connection to both the input/output pad 22 and the conductive stem 64. Accordingly, there is electrical contact from the input/output pad 22 through the solder bump 16 and the conductive stem 64 to the conductive via 63.

In a preferred embodiment, a microelectronic device has multiple input/output pads and the ceramic substrate has a conductive via and stem corresponding to each input/output pad. Solder bumps formed on each of the conductive stems are used to connect the input/output pads to the ceramic substrate. Each of the conductive vias having a separate external electrical connection may be accessed by electronic test equipment thereby allowing testing of the microelectronic device. The testing may include functional tests, power-on burn-in, parametric measurements, verification of functionality, erasure of Erasable Programmable Read Only Memories (EPROM), and programming of Programmable Logic Devices (PLDS). Similarly, it is highly desirable to perform a "burn-in" at elevated temperatures (e.g. 160° C.) and for long times (e.g. hundreds of hours) to identify early failures. A microelectronic device in combination with a ceramic substrate and a testing system is illustrated in FIG. 8D. When the testing is complete, the microelectronic device is removed from the ceramic substrate, and the solder bumps remain attached to respective input/output pads.

Figure 6E:
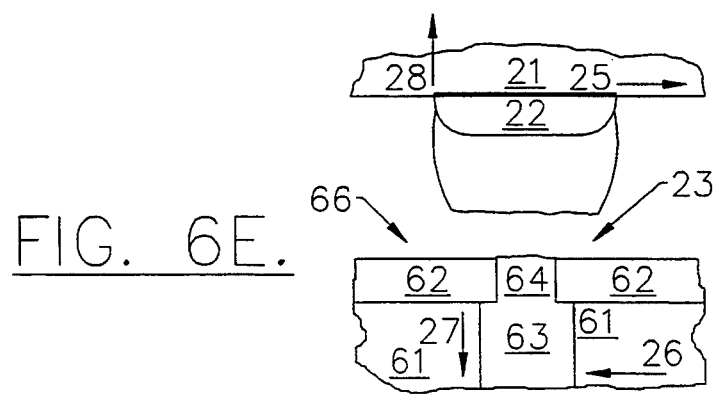

In FIG. 6E there is shown the step of removing the microelectronic device from the ceramic substrate 66. Because the mechanical connection between the input/output pad 22 is large relative to the mechanical connection to the conductive stem 64, most of the solder bump 16 remains attached to the input/output pad 22. The solder bump detaches from the conductive stem at the fracture site 23. The step of removing may be performed either hot or cold. The ceramic substrate may be replated after use thereby allowing multiple uses.

FIGS. 7A–7C illustrate alternate embodiments of the substrate of FIGS. 6A–6E. In FIG. 7A, the ceramic substrate 61 includes a conductive via comprising a molybdenum metallurgy portion 71 and a nickel portion 72. The substrate 61 is preferably a ceramic but may also be a plastic, resin or any other suitable insulating layer. The solder nonwettable layer 62 may be polyimide, silicon dioxide, silicon nitride, benzocyclobutene, chromium or a combination of the aforementioned or other solder nonwettable layers. The conductive stem may comprise a nickel portion 73 and a solder portion 74. The stem may also comprise a copper portion, palladium portion, or portions of other conductive materials.

In FIG. 7B, there is shown another structure for the ceramic substrate. In this embodiment, the conductive via comprises a single molybdenum metallurgy portion 71. The aperture 65 in the solder nonwettable layer 62 has a cross-sectional area which is small relative to the cross-sectional area of the conductive via.

In FIG. 7C, the ceramic substrate 61 does not require a distinct solder nonwettable layer. A single material which is both insulating and solder nonwettable is used to form the substrate 61. In this embodiment, a conductive via 63 is exposed on a face of the temporary substrate. The cross-sectional area of the exposed via 63 is small relative to the solder bump 16.

FIGS. 8A and 8B illustrate ceramic substrates provided with partial and full size solder bumps, respectively. In FIG. 8A, the microelectronic device 21 is already provided with solder bumps 16 on input/output pads 22 and testing is all that is required. Testing may include functional testing, burn-in, or other testing. In order to ensure that the solder bumps 16 remain attached to the input/output pads 22 of the microelectronic device 21 when separated from the temporary substrate 66, the cross-sectional area of the conductive stems are small relative to the cross-sectional area of associated solder bumps 16 and to the cross-sectional area of associated input/output pads 22. While the microelectronic device 21 of FIG. 8A already has solder bumps 16, some solder on the ceramic substrate may be required to facilitate the placement and alignment of the microelectronic device. The solder on the ceramic substrate increases the size of the area on which the existing solder bump will be placed. Accordingly, relatively small or partial size solder bumps 82 are formed on the ceramic substrate to facilitate alignment of the microelectronic device without adding unnecessary solder volume to the existing solder bumps. Accordingly, existing high capacity pick and place equipment may be used to align and place the microelectronic device.

In FIG. 8B, the microelectronic device does not include solder bumps. Full size solder bumps 16 are therefor required on the ceramic substrate. These bumps provide the entire solder volume required by the microelectronic device 21. Accordingly, an unbumped microelectronic device 21 may be attached to the ceramic substrate for testing. When the device is removed from the ceramic substrate, the solder bumps 16 will remain attached to the input/output pads 22 of the microelectronic device 21. Accordingly, a microelectronic device 21 may be tested and provided with solder bumps 16 in a single process.

As shown in FIG. 8C, full size solder bumps 16 and smaller or partial size solder bumps 82 may be formed on the same temporary substrate. The different sized solder bumps can be achieved by applying proportional electrical biases to the respective external electrical contacts 83 during the plating process. Since the size of each solder bump is a function of the electrical bias applied to the respective contact 83 during the plating process, solder bumps having different sizes can be formed in a single process.

FIGS. 8A–8C illustrate separate external electrical contacts 83 allowing separate electrical signals to be applied to each via. These contacts facilitate the testing of the microelectronic device 21 as well as the growth of different sized solder bumps in a single processing step.

As shown in FIG. 8D, once the microelectronic device 21 is connected to the substrate, the external electrical contacts 83 may be used to electrically connect the device to a testing system 85. Operations including parametric measurements, verification of functionality, erasure of Erasable Programmable Read-Only Memories (EPROM), programming of Programmable Logic Devices, and power-on burn-in, may be performed. It is also possible to perform "burn-in" at elevated temperatures (e.g. 160° C.) and for long times (e.g. hundreds of hours) to identify early failures. When testing is complete, the microelectronic device may be separated from the temporary substrate 61 with the solder bumps 16 remaining attached to the microelectronic device.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A temporary substrate for solder bumps comprising:
   a substrate having a plurality of conductive vias therein, said conductive vias extending to a face of said substrate, said substrate further including solder nonwettable material at the substrate face adjacent said conductive vias; and a plurality of solder bumps, a respective one of which is mechanically and electrically connected to a respective one of said conductive vias at the substrate face, and extends onto the solder nonwettable material adjacent the conductive via at the substrate face, said solder bumps having cross-sectional areas on said substrate face which are sufficiently greater than the cross sectional area of said conductive vias at said substrate face, so as to permit separation of said solder bump from the associated conductive via, upon application of a mechanical force thereto.

2. A temporary substrate according to claim 1 wherein said solder bumps are free of mechanical and electrical connection other than said mechanical and electrical connection to said conductive vias.

3. A temporary substrate according to claim 1 wherein said solder nonwettable material comprises a layer of a first solder nonwettable material adjacent said solder bumps and a layer of chromium on said first solder nonwettable material opposite said solder bumps.

4. A temporary substrate according to claim 1 wherein:
said substrate includes a second face opposite said substrate face;
said conductive vias extend from said substrate face to said second face;
said substrate further includes solder nonwettable material at the second face adjacent said conductive vias;
said conductive vias are solder filled vias; and
said solder filled vias extend onto the solder nonwettable material adjacent the solder filled via on said second face.

5. A temporary substrate according to claim 4 wherein said substrate is a flexible substrate.

6. A temporary substrate according to claim 5 in combination with a reel, wherein said flexible substrate is wound on said reel for use in tape automated bonding applications.

7. A temporary substrate according to claim 4 further comprising a conductive layer on said second face, extending over said solder filled vias.

8. A temporary substrate according to claim 1 in combination with a solder transfer chip, on said temporary substrate, opposite said solder bumps.

9. A temporary substrate according to claim 1 wherein said conductive via includes a first portion adjacent said substrate face and a second portion opposite said substrate face, said first portion having cross-sectional area which is small relative to a cross-sectional area of said second portion, said solder bump being electrically and mechanically connected to said first portion.

10. A temporary substrate according to claim 1 wherein each of said conductive vias is electrically isolated from one another on said temporary substrate.

11. A temporary substrate according to claim 10 in combination with a testing system which is electrically connected to said conductive vias.

12. A temporary substrate according to claim 10 wherein at least one of said solder bumps has a cross-sectional area which is larger than a cross-sectional area of another of said solder bumps.

13. A temporary substrate for solder bumps, said temporary substrate comprising:
a flexible substrate having a plurality of apertures therein, extending through said substrate, from a first face thereof to a second face thereof opposite said first face, said first and second faces being nonwettable to solder adjacent said apertures; and
a plurality of solder structures, each of which comprises:
a solder stem in said aperture, extending from said first face to said second face; and
a solder bump on said first face over said solder stem, and electrically and mechanically connected thereto.

14. A temporary substrate according to claim 13 wherein said solder bumps have cross-sectional areas on said first face which are sufficiently greater than the cross sectional area of said solder stem at said first face, so as to permit separation of said solder bump from the solder stem, upon application of a mechanical force thereto.

15. A temporary substrate according to claim 13 further comprising a solder plug on said second face over said solder stem, and electrically and mechanically connected thereto.

16. A temporary substrate according to claim 13 wherein said solder nonwettable material comprises a layer of a first solder nonwettable material adjacent said solder bumps and a layer of chromium on said first solder nonwettable material opposite said solder bumps.

17. A temporary substrate according to claim 15 wherein said solder plugs have a cross-sectional area which is greater than the cross-sectional area of said solder stem.

18. A temporary substrate according to claim 13 in combination with a reel wherein said flexible substrate is wound on said reel for use in tape automated bonding applications.

19. A temporary substrate according to claim 13 further comprising a conductive layer on said second face, extending over said solder filled vias.

20. A temporary substrate for solder bumps, said temporary substrate comprising:
a substrate having a plurality of conductive vias therein, said conductive vias extending to a face of said substrate;
a solder nonwettable layer on said substrate face and extending over said conductive vias, said solder nonwettable layer including an aperture therein over each of said vias, said aperture having cross-sectional area which is less than the cross-sectional area of said vias;
a conductive stem in each of said apertures, electrically and mechanically connected to an associated via; and
a plurality of solder bumps, a respective one of which is mechanically and electrically connected to a respective one of said conductive stems at the substrate face, and extends onto the solder nonwettable layer on said substrate face, said solder bumps having cross-sectional areas on said substrate face which are sufficiently greater than the cross sectional area of said stems at said substrate face, so as to permit separation of said solder bump from the associated stem, upon application of a mechanical force thereto.

21. A temporary substrate according to claim 20 wherein said solder bumps are free of mechanical and electrical connection other than said mechanical and electrical connection to said conductive stem.

22. A temporary substrate according to claim 20 wherein said substrate comprises an insulating material.

23. A temporary substrate according to claim 22 wherein said insulating material comprises a ceramic material.

24. A temporary substrate according to claim 20 wherein each of said conductive vias is electrically isolated from one another on said temporary substrate.

25. A temporary substrate according to claim 24 in combination with a testing system which is electrically connected to said conductive vias.

26. A temporary substrate according to claim 24 wherein at least one of said solder bumps has a cross-sectional area which is larger than a cross-sectional area of another of said solder bumps.

* * * * *